(12) United States Patent
Noh et al.

(10) Patent No.: US 10,340,293 B2
(45) Date of Patent: Jul. 2, 2019

(54) TRANSISTOR DISPLAY PANEL INCLUDING A TRANSISTOR AND AN OVERLAPPING REGION OF A GATE LINE AND DATA LINE

(71) Applicant: SAMSUNG DISPLAY CO., LTD., Yongin-si, Gyeonggi-Do (KR)

(72) Inventors: Jung-Hun Noh, Yongin-si (KR); Hyun Sup Lee, Hwaseong-si (KR); Sang-Hee Jang, Bucheon-si (KR); Hyung-Il Jeon, Seoul (KR); Byung Seok Choi, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/866,915

(22) Filed: Jan. 10, 2018

(65) Prior Publication Data
US 2018/0204856 A1 Jul. 19, 2018

(30) Foreign Application Priority Data
Jan. 18, 2017 (KR) .................. 10-2017-0008571

(51) Int. Cl.
| | |
|---|---|
| *H01L 31/036* | (2006.01) |
| *H01L 29/04* | (2006.01) |
| *H01L 29/15* | (2006.01) |
| *H01L 27/14* | (2006.01) |
| *H01L 27/12* | (2006.01) |
| *H01L 29/786* | (2006.01) |

(Continued)

(52) U.S. Cl.
CPC ........ *H01L 27/1222* (2013.01); *H01L 27/124* (2013.01); *H01L 27/1225* (2013.01); *H01L 27/1248* (2013.01); *H01L 29/41733* (2013.01); *H01L 29/42392* (2013.01); *H01L 29/7869* (2013.01); *H01L 29/78642* (2013.01); *H01L 29/78696* (2013.01); *G02F 1/1368* (2013.01); *G02F 1/136227* (2013.01); *H01L 27/3248* (2013.01)

(58) Field of Classification Search
CPC ........... H01L 27/1222; H01L 29/42392; H01L 29/78642; H01L 27/3248; G02F 1/136227; G02F 1/1368
See application file for complete search history.

(56) References Cited

U.S. PATENT DOCUMENTS

| | | |
|---|---|---|
| 3,986,199 A | 10/1976 | Williams |
| 4,104,858 A | 8/1978 | Williams |

(Continued)

FOREIGN PATENT DOCUMENTS

| | | |
|---|---|---|
| CN | 204155937 | 2/2015 |
| JP | 59-108349 | 6/1984 |

(Continued)

*Primary Examiner* — Ismail A Muse
(74) *Attorney, Agent, or Firm* — F. Chau & Associates, LLC

(57) ABSTRACT

A transistor display panel includes a substrate, a gate line disposed on the substrate, a data line disposed on the substrate, and a transistor disposed on the substrate. The transistor includes a first electrode, a second electrode overlapping the first electrode, a semiconductor layer disposed between the first electrode and the second electrode, and a gate electrode. The semiconductor layer is disposed in an overlapping region where the gate line and the data line overlap each other.

18 Claims, 12 Drawing Sheets

(51) Int. Cl.
  *H01L 29/423*  (2006.01)
  *H01L 29/417*  (2006.01)
  *G02F 1/1368*  (2006.01)
  *H01L 27/32*  (2006.01)
  *G02F 1/1362*  (2006.01)

(56) References Cited

U.S. PATENT DOCUMENTS

| | | | |
|---|---|---|---|
| 6,320,221 B1 * | 11/2001 | Choi | G02F 1/1368 |
| | | | 257/329 |
| 6,897,158 B2 | 5/2005 | Sharma | |
| 7,154,332 B2 | 12/2006 | Tsuchi | |
| 7,629,633 B2 | 12/2009 | Chan et al. | |
| 8,378,456 B1 | 2/2013 | Shepard | |
| 8,643,087 B2 | 2/2014 | Sandhu et al. | |
| 8,890,371 B2 | 11/2014 | Gotou | |
| 9,153,732 B2 | 10/2015 | Oraw | |
| 9,196,606 B2 | 11/2015 | Oraw | |
| 2006/0131568 A1 | 6/2006 | Meng et al. | |
| 2008/0237580 A1 | 10/2008 | Okuyama et al. | |
| 2009/0230383 A1 | 9/2009 | Meng et al. | |
| 2011/0084338 A1 * | 4/2011 | Ohnuma | H01L 29/78675 |
| | | | 257/347 |
| 2014/0146598 A1 | 5/2014 | Sandhu et al. | |
| 2015/0001542 A1 * | 1/2015 | Jang | H01L 27/1225 |
| | | | 257/67 |
| 2015/0091006 A1 * | 4/2015 | Cho | H01L 29/786 |
| | | | 257/43 |
| 2016/0268308 A1 * | 9/2016 | Cho | G02F 1/134363 |
| 2018/0120619 A1 * | 5/2018 | Cho | G02F 1/13394 |

FOREIGN PATENT DOCUMENTS

| | | |
|---|---|---|
| JP | 3941032 | 7/2007 |
| JP | 2009-081237 | 4/2009 |
| KR | 10-0289654 | 2/2001 |

* cited by examiner

TRANSISTOR DISPLAY PANEL INCLUDING A TRANSISTOR AND AN OVERLAPPING REGION OF A GATE LINE AND DATA LINE

CROSS-REFERENCE TO RELATED APPLICATION

This application claims priority under 35 U.S.C. § 119 to Korean Patent Application No. 10-2017-0008571 filed in the Korean Intellectual Property Office on Jan. 18, 2017, the disclosure of which is incorporated by reference herein in its entirely.

TECHNICAL FIELD

The present invention relates to a transistor display panel and a display device including the transistor display panel, and more particularly, to a transistor array panel.

DISCUSSION OF THE RELATED ART

A transistor included in various electronic devices such as a display device includes a gate electrode, a source electrode, a drain electrode, and a semiconductor layer. The transistor may be used as a switching element or a driving element in the display device. A transistor array panel in the display device is used as a circuit board to drive pixels in the display device. The transistor array panel may include a gate line for transmitting a gate signal and a data line for transmitting a data voltage corresponding to an image signal, and may include a pixel electrode connected to the transistor.

To achieve a relatively high resolution in a display device, a method of reducing a plane size of the transistor may be considered. In general, the transistor used in the display device has a channel region that is formed to be substantially parallel to the substrate plane surface. In addition, a source electrode and a drain electrode of the transistor are formed so as not to overlap each other or the channel region.

SUMMARY

According to an exemplary embodiment of the present invention, a transistor display panel includes a substrate, a gate line disposed on the substrate, a data line disposed on the substrate, and a transistor disposed on the substrate. The transistor includes a first electrode, a second electrode overlapping the first electrode, a semiconductor layer disposed between the first electrode and the second electrode, and a gate electrode. The semiconductor layer is disposed in an overlapping region where the gate line and the data line overlap each other.

In an exemplary embodiment of the present invention, the gate electrode surrounds at least a portion of the semiconductor layer.

In an exemplary embodiment of the present invention, the gate line includes a hole, and the semiconductor layer is disposed within the hole.

In an exemplary embodiment of the present invention, the hole overlaps the data line.

In an exemplary embodiment of the present invention, the first electrode is a part of the data line, and the gate electrode is a part of the gate line.

In an exemplary embodiment of the present invention, the first electrode is aligned in parallel with the data line, and the gate electrode is aligned in parallel with the gate line.

In an exemplary embodiment of the present invention, the transistor display panel further includes a first insulating layer disposed between the first electrode and the gate electrode, and a second insulating layer disposed between the gate electrode and the semiconductor layer. The semiconductor layer is connected with the first electrode through a first contact hole formed in the first and second insulating layers.

In an exemplary embodiment of the present invention, the gate line includes a hole that surrounds the first contact hole, and the semiconductor layer is disposed within the first contact hole.

In an exemplary embodiment of the present invention, the second insulating layer overlaps the gate electrode.

In an exemplary embodiment of the present invention, the semiconductor layer has a column shape.

In an exemplary embodiment of the present invention, the transistor display panel further includes an insulator disposed between the first insulating layer and the gate line.

In an exemplary embodiment of the present invention, the transistor display panel further includes a pixel electrode electrically connected to the transistor.

In an exemplary embodiment of the present invention, the transistor display panel further includes an insulating layer disposed between the second electrode and the pixel electrode. The pixel electrode includes an extension connected with the second electrode through a second contact hole formed in the insulating layer.

In an exemplary embodiment of the present invention, the transistor display panel further includes a first insulating layer disposed between the first electrode and the gate electrode, a second insulating layer disposed between the gate electrode and the semiconductor layer, and a third insulating layer disposed on the semiconductor layer. The semiconductor layer is connected with the first electrode through a first contact hole formed in the first and second insulating layers, and the second electrode is connected with the semiconductor layer through a second contact hole formed in the third insulating layer.

In an exemplary embodiment of the present invention, the second contact hole overlaps the first contact hole.

In an exemplary embodiment of the present invention, the semiconductor layer includes a central portion and a peripheral portion extending away from the central portion. The central portion has an incline and the peripheral portion is substantially horizontal, and the second contact hole overlaps the peripheral portion, but does not overlap the central portion.

In an exemplary embodiment of the present invention, at least a part of each of the first electrode, the gate electrode, and the second electrode is disposed in the overlapping region.

In an exemplary embodiment of the present invention, the first electrode receives a data signal from the data line, and the gate electrode receives a gate signal from the gate line.

According to an exemplary embodiment of the present invention, a transistor display panel includes a substrate, a first electrode disposed on the substrate, and a gate line disposed on the substrate and including a hole. The transistor display panel further includes a gate electrode overlapping the first electrode. The transistor display panel additionally includes a semiconductor layer disposed in the hole and disposed on the first electrode. The semiconductor layer extends vertically from a first surface of the first electrode, and is at least partially surrounded by the gate electrode. The transistor display panel further includes a second electrode disposed on the semiconductor layer.

In an exemplary embodiment of the present invention, the semiconductor layer has a V-shaped cross-sectional shape.

In an exemplary embodiment of the present invention, the second electrode overlaps the first electrode.

BRIEF DESCRIPTION OF THE DRAWINGS

A more complete appreciation of the present invention and many of the attendant aspects thereof will be readily obtained as the same becomes better understood by reference to the following detailed description when considered in connection with the accompanying drawing, wherein.

DETAILED DESCRIPTION OF THE EMBODIMENTS

Figure 1:
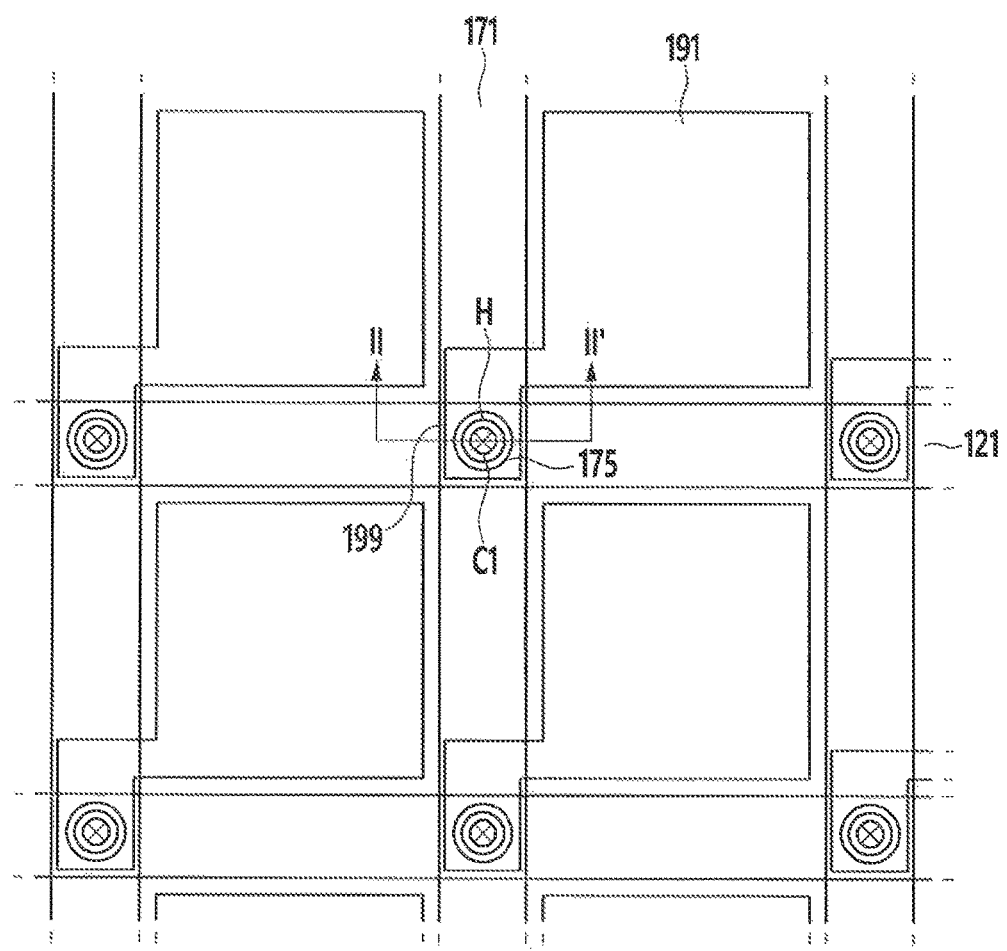
FIG. 1 is a top plan view illustrating a transistor display panel according to an exemplary embodiment of the present invention.

Exemplary embodiments of the present invention will be described more fully hereinafter with reference to the accompanying drawings.

In the figures, like reference numerals may denote like elements or features, and thus their descriptions may be omitted. In the drawings, the thickness or sizes of elements and/or components in the drawings may be exaggerated for clarity.

It will be understood that when an element such as a layer, film, region, or substrate is referred to as being "on" another element, it can be directly on the other element or intervening elements may also be present.

A transistor display panel according to exemplary embodiments of the present invention will now be described in detail with reference to the accompanying drawings.

Figure 2:
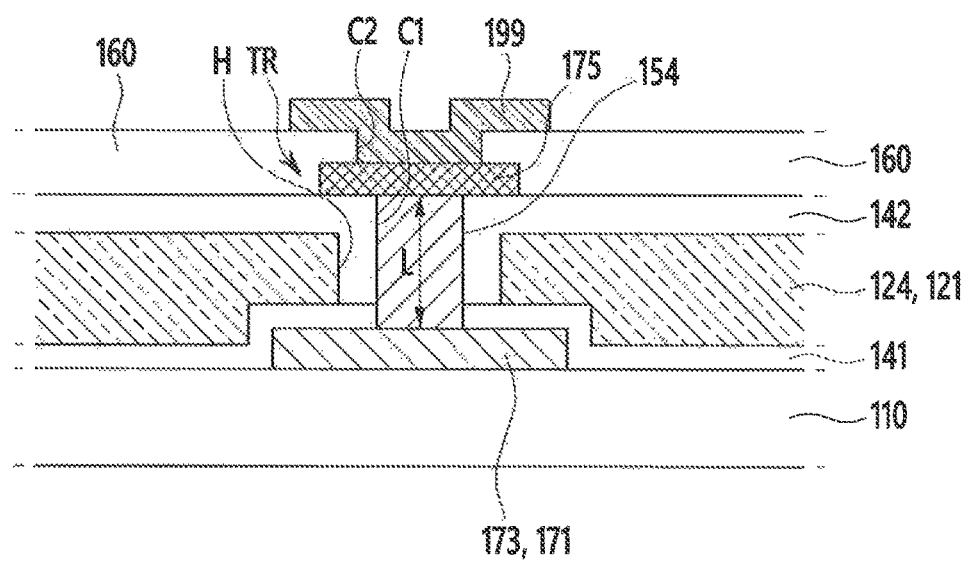
FIG. 2 is a cross-sectional view taken along a line II-II' of FIG. 1 according to an exemplary embodiment of the present invention.

FIG. 1 is a top plan view illustrating a transistor display panel according to an exemplary embodiment of the present invention, and FIG. 2 is a cross-sectional view taken along a line II-II' of FIG. 1 according to an exemplary embodiment of the present invention.

Referring to FIG. 1 and FIG. 2, the transistor display panel includes a substrate 110, and gate lines 121, data lines 171, pixel electrodes 191, and transistors TR disposed thereon. A region corresponding to one pixel electrode 191 or a substantially quadrangular region surrounded by the gate lines 121 and the data lines 171 may be a pixel area corresponding to one pixel. Although four pixel regions are illustrated in FIG. 1 by way of example, the transistor display panel may include, for example, 100,000 or more, 1 million or more, or 10 million or more pixel areas depending on resolution of the display device.

The substrate 110, which can determine an overall size of the transistor display panel, may be made of an insulating material such as glass or plastic. The substrate 110 may be optically transparent.

The gate lines 121 are disposed on the substrate 110 in a first direction (e.g., am X-direction). The gate lines 121 serve to transfer gate signals including a gate-on voltage and a gate-off voltage. The data lines 171 are disposed on the substrate 110 in a second direction (e.g., a Y-direction). The data lines 171 transmit data signals used to express gray levels for the connected pixels depending on image data inputted into the display device. Unlike what is illustrated, the gate lines 121 may extend in the second direction, and the data lines 171 may extend in the first direction. The gate lines 121 may extend in the first direction, and the data lines 171 may extend in the second direction substantially perpendicular to the first direction. The gate lines 121 and the data lines 171 may include a metal such as copper, aluminum, silver, molybdenum, chromium, tantalum, titanium, tungsten, nickel, and/or metal alloys thereof. The gate lines 121 and the data lines 171 may be a single layer or a multilayered structure.

Each of the pixel electrodes 191 is connected with the gate line 121 and the data line 171 through a transistor TR which is a switching element. The pixel electrode 191 receives a data signal (e.g., corresponding to a data voltage or a gray voltage) transferred through the data line 171 when the transistor TR is turned on by a gate-on voltage transferred through the gate line 121. In a case of the liquid crystal display, the pixel electrode 191 can form an electric field together with a common electrode to which a common voltage is applied to adjust an orientation of liquid crystal molecules in a liquid crystal layer. In a case of the organic light emitting diode display, the pixel electrode 191 may be connected with a transistor (e.g., a driving transistor) different from that shown in the drawing, and may constitute an organic light emitting diode together with an organic emission layer and a common electrode. The pixel electrode 191 may include a transparent conductive material such as an indium tin oxide (ITO) or an indium zinc oxide (IZO).

The transistor TR is positioned in a region where the gate line 121 and the data line 171 cross each other. For example, the transistor TR is positioned in a substantially rectangular area in which the gate line 121 and the data line 171 overlap each other. Since the transistor TR is positioned in the region where the gate line 121 and the data line 171 overlap each other in the transistor display panel, a region for disposing the transistor TR might not be provided or the region can be minimized. Accordingly, it is possible to increase the aperture ratio and the resolution which corresponds to a ratio and a number of regions in which an actual contrast can be displayed in the display device.

Hereinafter, a structure of the transistor TR will be described. The transistor TR includes a first electrode 173, a second electrode 175, a gate electrode 124, and a semiconductor layer 154. One of the first electrode 173 and the second electrode 175 is a source electrode, and the other thereof is a drain electrode. For example, the first electrode 173 may be the source electrode, and the second electrode 175 may be the drain electrode, or vice versa. The source electrode and the drain electrode of the transistor TR may be determined h a direction of a carrier flowing through a channel region of the semiconductor layer 154 when a gate-on voltage is applied to the gate electrode 124, and the carrier flows from the source electrode to the drain electrode. Accordingly, when the transistor TR is operated, an electron flows from the source electrode to the drain electrode in an n-type transistor, while a hole flows from the source electrode to the drain electrode in a p-type transistor.

The first electrode 173 may be disposed at a lowermost portion of the transistor TR. The first electrode 173 is a part of the data line 171. For example, the first electrode 173 corresponds to a part of the data line 171 itself, which extends in the second direction (e.g., the Y-direction). The first electrode 173 is not a portion extending or expanding from the data line 171. Accordingly, the data line 171 including the first electrode 173 may be substantially straight. In the transistor TR, the first electrode 173 may correspond to an input terminal which receives a data signal, and the data signal may be transferred through the data line 171. A buffer layer may be interposed between the substrate 110 and the first electrode 173 to prevent diffusion of impurities that may deteriorate the characteristics of the semiconductor or the like and to prevent penetration of moisture or the like.

A first insulating layer 141 is disposed above the first electrode 173, and the gate electrode 124 is disposed above the first insulating layer 141. The gate electrode 124 is a part of the gate line 121. For example, the gate electrode 124 corresponds to a part of the gate line 121 itself, which extends in the first direction (e.g., the X-direction) which crosses the second direction. The gate electrode 124 might not extend or otherwise expand from the gate line 121. Accordingly, the gate line 121 including the gate electrode 124 may be substantially straight. A hole H is formed in the gate line 121 to overlap the first electrode 173. The gate electrode 124 may correspond to a peripheral portion of the hole H of the gate line 121. For example, the gate electrode 124 surrounds the hole H of the gate line 121.

A second insulating layer 142 is disposed on the gate electrode 124, and the second electrode 175 is disposed above the second insulating layer 142 to overlap the first electrode 173. In the transistor TR, the second electrode 175 may correspond to an output terminal for outputting a data signal or the like. The first insulating layer 141 and the second insulating layer 142 may include an inorganic insulating material such as a silicon oxide or a silicon nitride, and may include an organic insulating material. The second electrode 175 may include a metal such as copper, aluminum, silver, molybdenum, chromium, tantalum, titanium, tungsten, nickel, and/or metal alloys thereof, and may be a single layer or a multilayered structure.

The semiconductor layer 154 is disposed between the first electrode 173 and the second electrode 175, and has a lower surface connected with the first electrode 173 and an upper surface connected with the second electrode 175. A contact hole C1 is formed in the first insulating layer 141 and the second insulating layer 142 for the semiconductor layer 154 to be disposed between the first electrode 173 and the second electrode 175, and the semiconductor layer 154 fills the contact hole C1. The contact hole C1 is formed in the hole 11 of the gate line 121, for example, in a plan view, and is smaller than the hole H. Accordingly, the gate electrode 124 and the semiconductor layer 154 are separated from each other, and the semiconductor layer 154 extends through the gate line 121 by means of the hole H of the gate line 121.

In addition, the gate electrode 124 has a structure surrounding the semiconductor layer 154. The semiconductor layer 154 may have a substantially columnar shape (and thus may have a substantially rectangular cross-section), but it is not limited thereto, and may have various shapes of solid columns. For example, the semiconductor layer 154 may have a cylindrical shape or a triangular shape.

The semiconductor layer 154 may include a metal oxide, amorphous silicon, polysilicon, or the like. The metal oxide may include at least one of, e.g., a zinc oxide (ZnO), a zinc-tin oxide (ZTO), a zinc-indium oxide (ZIO), an indium oxide (InO), a titanium oxide (TiO), an indium-gallium-zinc oxide (IGZO), and an indium-zinc-tin oxide (IZTO).

The second insulating layer 142 is disposed in a space between the gate electrode 124 and the semiconductor layer 154. The semiconductor layer 154 may be disposed to contact an upper surface of the first electrode 173 and a lower surface of the second electrode 175. Unlike the illustrated exemplary embodiment, an ohmic contact layer for reducing contact resistance may be disposed between the first electrode 173 and the semiconductor layer 154 and/or between the semiconductor layer 154 and the second electrode 175. A third insulating layer may be disposed between the second insulating layer 142 and the second electrode 175, and the second electrode 175 may be connected with the semiconductor layer 154 through a contact hole formed in the third insulating layer.

As shown in FIG. 1 and FIG. 2, in the transistor TR, the semiconductor layer 154 is disposed between the first electrode 173 and the second electrode 175 such that the semiconductor layer 154, the first electrode 173, and the second electrode 175 overlap each other in a direction perpendicular to a surface of the substrate 110, and the semiconductor layer 154 has a structure in which the gate electrode 124 is disposed to surround the semiconductor layer 154. A channel region may be formed to be substantially perpendicular to the surface of the substrate 110 in the transistor TR having such a structure, and the transistor TR may have a channel length L which substantially corresponds to a distance between the first electrode 173 and the second electrode 175. For example, the channel length L may correspond to the contact hole C1 in the first and second insulating layers 141 and 142. Since the channel region is formed to be substantially perpendicular to the surface of the substrate 110, it is possible to minimize a planar size of the transistor TR regardless of the channel length L.

An insulating layer 160 which may be a planarization layer is disposed on the second electrode 175, and an extension 199 of the pixel electrode 191 may be connected with the second electrode 175 through a contact hole C2 formed in the insulating layer 160 to overlap the second electrode 175. The pixel electrode 191 may receive a data signal outputted from the second electrode 175. The insulating layer 160 may include an organic insulating material and/or an inorganic insulating material. In a case of the organic light emitting diode display, a transistor such as a driving transistor or a compensation transistor may be connected with the second electrode 175 instead of the pixel electrode 191.

The contact hole C2 may be formed at a region that is overlapped with the gate line 121 and the data line 171, and may overlap the contact hole C1. Both of the transistor TR and the contact hole C2 for connecting the pixel electrode 191 to the transistor TR through the extension 199 may be formed in the region that is overlapped with the gate line 121 and the data line 171 to maximize the aperture ratio and the resolution of the display device. In an exemplary embodiment of the present invention, the extension 199 of the pixel electrode 191 may constitute the second electrode 175 of the transistor TR. For example, the transistor TR might not include the second electrode 175, and instead, the extension 199 may be directly connected to an upper end of the semiconductor layer 154 and, in effect, functioning as the second electrode 175.

Hereinabove, the transistor display panel according to an exemplary embodiment of the present invention has been described in detail with reference to FIG. 1 and FIG. 2. Hereinafter, a method of manufacturing the transistor display panel will be described with reference to FIG. 3, FIG. 4, FIG. 5, and FIG. 6.

FIG. 3, FIG. 4, FIG. 5, and FIG. 6 are cross-sectional views illustrating a method of manufacturing a transistor display panel according to an exemplary embodiment of the present invention.

Figure 3:
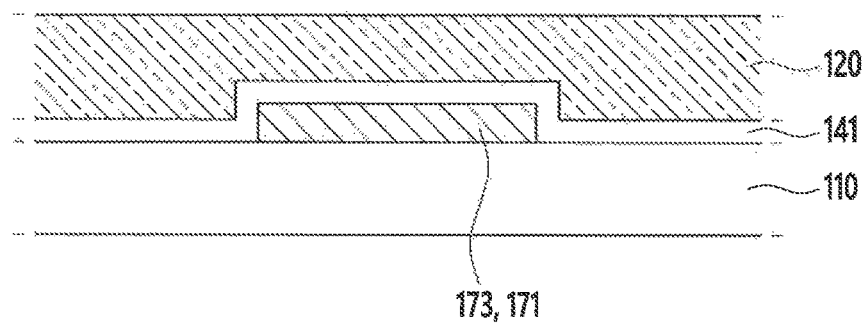
FIG. 3, FIG. 4, FIG. 5, and FIG. 6 are cross-sectional views illustrating a method of manufacturing a transistor display panel according to an exemplary embodiment of the present invention.

Referring to FIG. 3, a first conductive layer is formed by stacking a conductive material such as a metal or metal alloy on the substrate 110, and is patterned to form the data line 171 including the first electrode 173 of the transistor TR. The patterning may be performed by using a photosensitive film and a photolithography process. In addition, the first insulating layer 141 and a second conductive layer 120 are sequentially stacked on the substrate 110 on which the data line 171 is formed. The first insulating layer 141 may be formed by stacking an inorganic insulating material, and the second conductive layer 120 may be formed by stacking a conductive material such as a metal.

Figure 4:
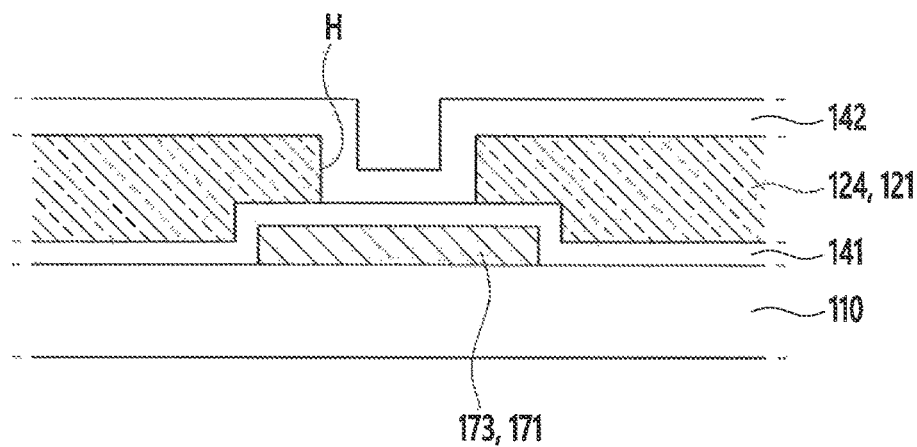

Referring to FIG. 4, the gate line 121 including the hole H overlapping the first electrode 173 and the gate electrode 124 of the transistor TR is formed by patterning the second conductive layer 120. In addition, the second insulating layer 142 is formed by stacking an inorganic insulating material and/or an organic insulating material on the gate line 121.

Figure 5:
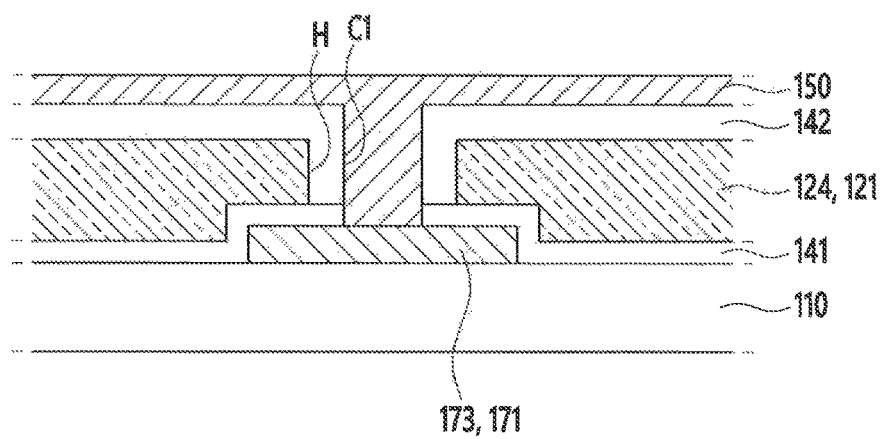

Referring to FIG. 5, a contact hole C1 is formed in the first and second insulating layers 141 and 142, and overlaps the first electrode 173. The contact hole C1 is formed in the hole H of the gate line 121. The contact hole C1 may be formed such that an outer circumferential surface thereof is substantially perpendicular to the surface of the substrate 110, and the contact hole C1 may be formed into, for example, a substantially cylindrical shape. In addition, a semiconductor layer 150 is formed on the substrate 110 by stacking semiconductor material in the contact hole C1 to fill the contact hole C1. In this case, the semiconductor layer 150 may include a first portion formed to fill the contact hole C1 and a second portion formed on the second insulating layer 142.

Figure 6:
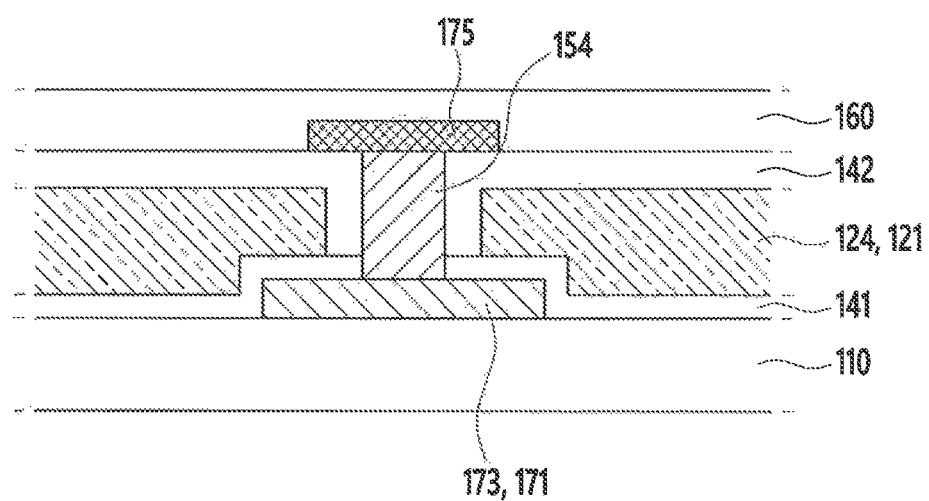

Referring to FIG. 6, a portion of the semiconductor layer 150 on the second insulating layer 142 is removed by chemical mechanical polishing (CMP) or the like to leave only a portion of the semiconductor layer 150 filling the contact hole C1, thereby forming the semiconductor layer 154 of the transistor TR. In addition, the second electrode 175 of the transistor TR which contacts the semiconductor layer 154 is formed by stacking and patterning a conductive material such as a metal. The insulating layer 160 is then formed by stacking an organic insulating material and the like on the substrate 110 on which the second electrode 175 is formed. For example, the insulating layer 160 overlaps the second electrode 175.

Subsequently, referring to FIG. 2, the contact hole C2 is formed to overlap the second electrode 175. The pixel electrode 191 and the extension 199 are formed by stacking a transparent conductive material and the like, and the extension 199 of the pixel electrode 191 is formed to overlap the contract hole C2. Accordingly, it is possible to manufacture a transistor display panel in which the extension 199 of the pixel electrode 191 is connected with the second electrode 175 through the contact hole C2, and the transistor TR and the contact holes C1 and C2 are all formed in the region where the gate line 121 overlaps the data line 171.

Hereinafter, a transistor display panel according to an exemplary embodiment of the present invention will be described while focusing on differences from aforementioned exemplary embodiments of the present invention, and descriptions of the same and/or similar features may be omitted or simplified.

Figure 7:
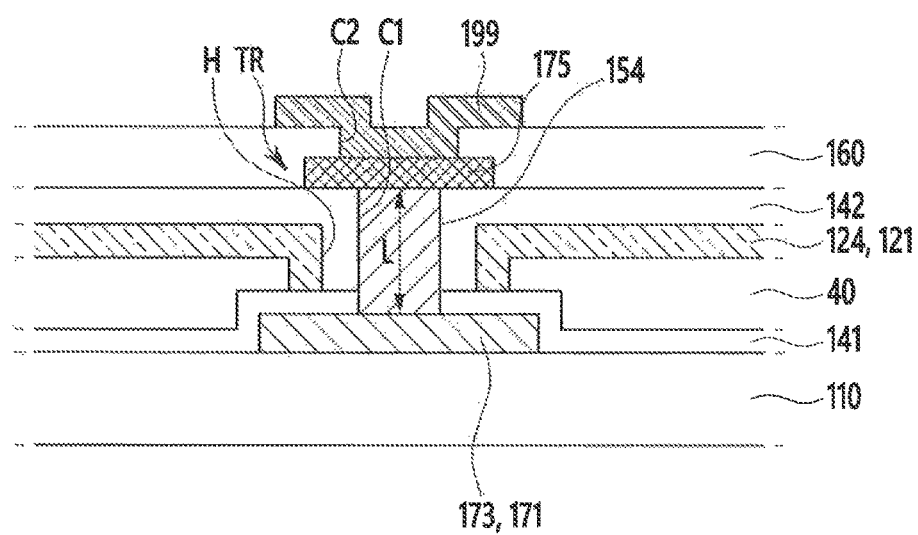
FIG. 7 is a cross-sectional view taken along a line II-II' of FIG. 1 according to an exemplary embodiment of the present invention.
Figure 8:
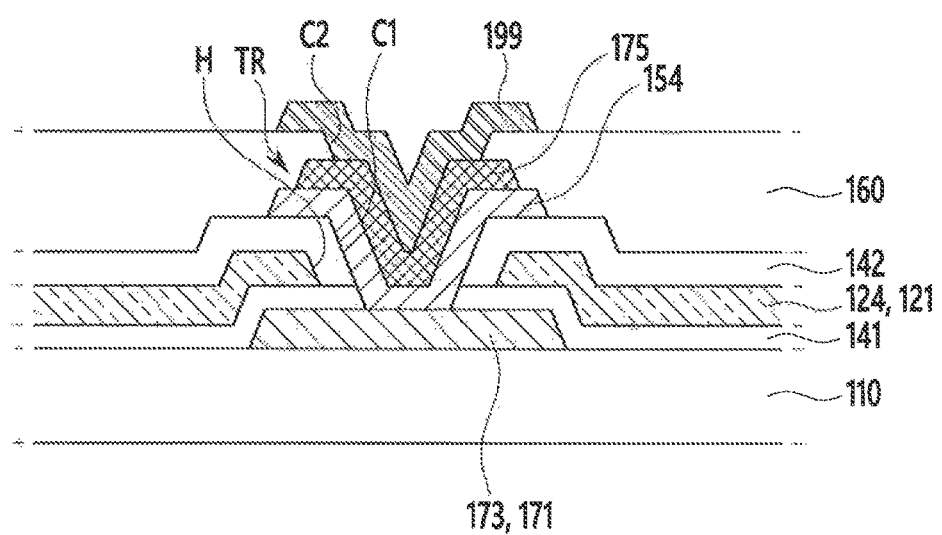
FIG. 8 is a cross-sectional view taken along a line II-II' of FIG. 1 according to an exemplary embodiment of the present invention.

FIG. 7 and FIG. 8 are cross-sectional views taken along a line II-II' of FIG. 1 according to an exemplary embodiment of the present invention.

First, referring to FIG. 7, an exemplary embodiment of the present invention is generally identical to an exemplary embodiment of the present invention illustrated in FIG. 2. However, an insulator 40 is disposed between the first insulating layer 141 and the gate line 121. In the vertical transistor, a channel length L may depend on a distance between the first electrode 173 and the second electrode 175. When the channel length L is too short, there may be a problem in the reliability of the transistor TR, for example, an off current (e.g., a leakage current) may increase. In an exemplary embodiment of the present invention, the distance between the first electrode 173 and the second electrode 175 may increase by adding the insulator 40 of a predetermined thickness below the gate line 121, thereby increasing the channel length L. In addition, although the gate line 121 and the gate electrode 124 which is a part of the gate line 121 are not relatively thick, it is possible to secure an increased channel length L by adjusting the thickness of the insulator 40. The insulator 40 may be formed by stacking an inorganic insulating material or an organic insulating material.

Referring to FIG. 8, the semiconductor layer 154 is formed to have a V-shaped cross-sectional shape passing through a center of the transistor TR, unlike exemplary embodiments of the present invention of FIG. 2 and FIG. 7 in which the semiconductor layer 154 has a three-dimensional pillar shape.

For example, similar to FIG. 2, the contact hole C1 is formed in the first and second insulating layers 141 and 142 such that an external circumferential surface of the contact hole C1 is substantially perpendicular to the plane of the substrate 110, and forming the semiconductor layer 154 to fill the contact hole C1 may minimize a formation region of the transistor TR and ensure a predetermined channel length. For example, the external circumferential surface of the contact hole C1 may include inner surfaces of the first and second insulating layers 141 and 142 formed from the contact hole C1 penetrating the first and second insulating layers 141 and 142. However, forming the semiconductor layer 154 to have a V-shaped cross-sectional shape that passes through a center of the transistor TR may be a complicated or difficult process. In an exemplary embodiment of the present invention, the contact hole C1 has a shape of which a width increases as a distance from the substrate 110 increases. For example, edges of the first and second insulating layers 141 and 142 forming the contact hole C1 are tapered at a predetermined angle. The semiconductor layer 154 has a substantially V-shaped cross-sectional shape when it is formed in the contact hole C1. An upper surface of the semiconductor layer 154 may have a substantially V-shaped cross-sectional shape, but may be formed to be substantially flat on an upper surface of the second insulating layer 142 and the first electrode 173. The semiconductor layer 154 may be formed, for example, by forming the contact hole C1 in the first and second insulating layers 141 and 142, and then stacking and patterning a semiconductor material on the substrate 110.

The second electrode 175 is disposed on the semiconductor layer 154 to contact the semiconductor layer 154. The insulating layer 160 is disposed on the second electrode 175, and the extension 199 of the pixel electrode 191 is disposed on the insulating layer 160. The extension 199 is connected with the second electrode 175 through the contact hole C2 formed in the insulating layer 160. In an exemplary embodiment of the present invention, a third insulating layer may be disposed between the semiconductor layer 154 and the second electrode 175, and the second electrode 175 may be connected with the semiconductor layer 154 through a contact hole formed in the third insulating layer. The illustrated second electrode 175 may be omitted, and the extension 199 may be disposed immediately on the semiconductor layer 154. In this case, the extension 199 serves as a second electrode 175 of the transistor TR. In an aforementioned exemplary embodiment of the present invention, since the transistor TR and the contact hole C2 for connecting the pixel electrode 191 to the transistor TR are disposed in the overlapping region of the gate line 121 and the data line 171, it is possible to increase the aperture ratio and the resolution of the display device.

In an exemplary embodiment of the present invention, the semiconductor layer 154 may be formed to have a squared U-shaped cross-section passing through a center of the transistor TR. The contact hole C1 may be formed in the first and second insulating layers 141 and 142 to have a rectangular shape, and the semiconductor layer 154 may have a U-shaped cross-section when it is formed in the contact hole C1. In addition, the second electrode 175 may be disposed in the semiconductor layer 154, and may also have a U-shaped cross-section.

A transistor display panel according to an exemplary embodiment of the present invention will be described with reference to FIG. 9 and FIG. 10.

Figure 9:
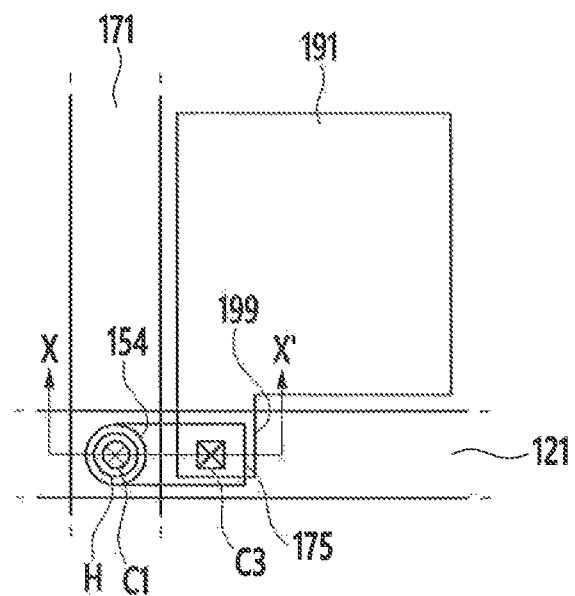
FIG. 9 is a top plan view illustrating a transistor display panel according to an exemplary embodiment of the present invention.
Figure 10:
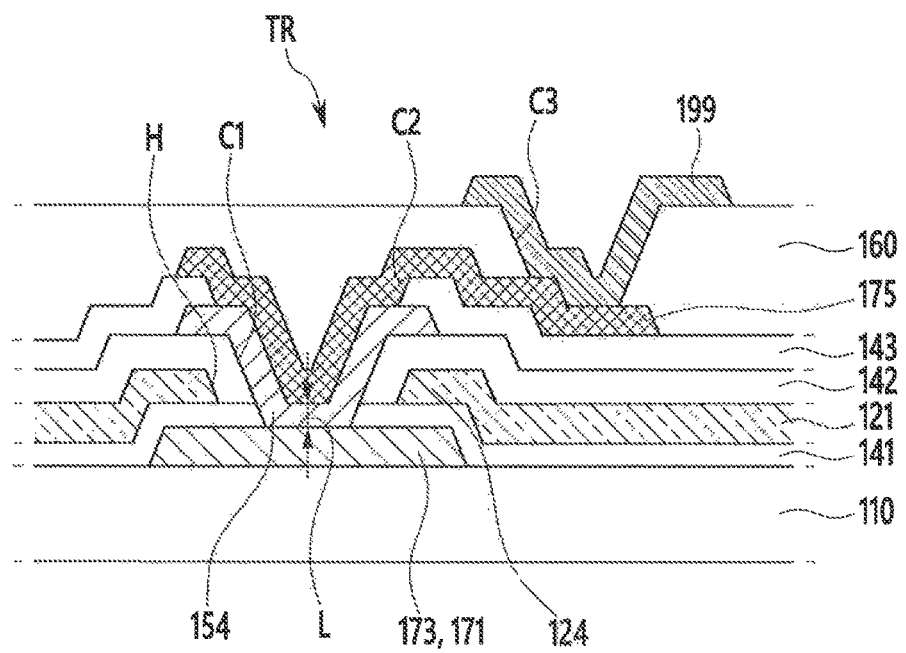
FIG. 10 is a cross-sectional view taken along a line X-X' of FIG. 9 according to an exemplary embodiment of the present invention.

FIG. 9 is a top plan view illustrating a transistor display panel according to an exemplary embodiment of the present invention, and FIG. 10 is a cross-sectional view taken along a line X-X' of FIG. 9 according to an exemplary embodiment of the present invention.

FIG. 9 illustrates one pixel area, and such pixel areas may be arranged, e.g., in a matrix form in a transistor display panel. Referring to FIG. 9 and FIG. 10, on the substrate 110, the gate line 121 may extend in a first direction (e.g., the X-direction), and the data line 171 may extend in a second direction (e.g., the Y-direction). In the overlapping region of the gate line 121 and the data line 171, a portion of the gate line 121 serves as the gate electrode 124 of the transistor TR, and a portion of the data line 171 serves as a first electrode 173 of the transistor TR. The semiconductor layer 154 of the transistor TR is connected with the first electrode 173 through the contact hole C1 formed in the first and second insulating layers 141 and 142. The contact hole C1 may have a shape of which a width increases as a distance from the substrate 110 increases. This structure is substantially the same as that of an exemplary embodiment of FIG. 8. However, FIG. 10 is different from FIG. 8 regarding the disposal of the second electrode 175 of the transistor TR and a position of the contact hole C3 for the connection of the extension 199 of the pixel electrode 191.

For example, a third insulating layer 143 is disposed on the semiconductor layer 154, and the second electrode 175 of the transistor TR overlaps the third insulating layer 143 through the contact hole C2 formed in the semiconductor layer 154. For example, the second electrode 175 may be in contact with the third insulating layer 143. The contact hole C2 may be formed to be sufficiently wide, for example, to substantially expose an upper surface of the semiconductor layer 154. For example, the semiconductor layer 154 may include an inclined central portion that is in contact with an inner surface of the contact hole C1 and a substantially horizontal peripheral portion that is disposed on an upper surface of the second insulating layer 142, and the contact hole C2 may be formed to expose the inclined central portion of the semiconductor layer 154 and the substantially horizontal peripheral portion of the semiconductor layer 154. The second electrode 175 is in contact with the semiconductor layer 154 in the overlapping region of the gate line 121 and the data line 171, and is formed to overlap the third insulating layer 143. For example, the second electrode 175 may include a portion that extends in a direction away from a point of contact between the second electrode 175 and the semiconductor layer 154. As an additional example, the second electrode 175 may extend in a direction in which the gate line 121 extends. Accordingly, the second electrode 175 may include a portion extending in a direction away from the overlapping region of the gate line 121 and the data line 171. The portion of the second electrode 175 extending in a direction away from the overlapping region of the gate line 121 and the data line 171 may overlap the gate line 121 as illustrated, or may overlap the data line 171.

The insulating layer 160 is disposed on the second electrode 175, and the extension 199 of the pixel electrode 191 is connected with the second electrode 175 through the contact hole C3 formed in the insulating layer 160. The contact hole C3 does not overlap the contact hole C1 formed in the first and second insulating layers 141 and 142, but overlaps the portion of the second electrode 175 that extends in the direction away from the point of contact between the second electrode 175 and the semiconductor layer 154. The third insulating layer 143 may be omitted. The contact hole C3 may be formed such that at least a portion thereof is positioned in the overlapping region of the gate line 121 and the data line 171.

The extended portion of the second electrode 175 may be connected to the extension 199 of the pixel electrode 191, and the transistor TR may be substantially disposed in the overlapping region of the gate line 121 and the data line 171. Although the second electrode 175 deviates from the overlapping region, it may be formed in the region in which the gate line 121 or the data line 171 are disposed. Accordingly, the aperture ratio is not determined by the transistor TR. According to an exemplary embodiment of the present invention, a position of the contact hole C3 for the connection of the extension 199 of the pixel electrode 191 to the transistor TR is not limited to the overlapping region of the gate line 121 and the data line 171.

A transistor display panel according to an exemplary embodiment of the present invention will be described with reference to FIG. 11 and FIG. 12.

Figure 11:
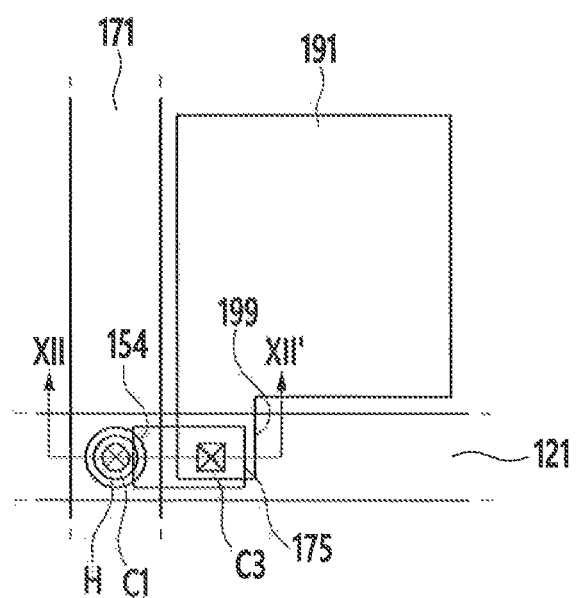
FIG. 11 is a top plan view illustrating a transistor display panel according to an exemplary embodiment of the present invention.
Figure 12:
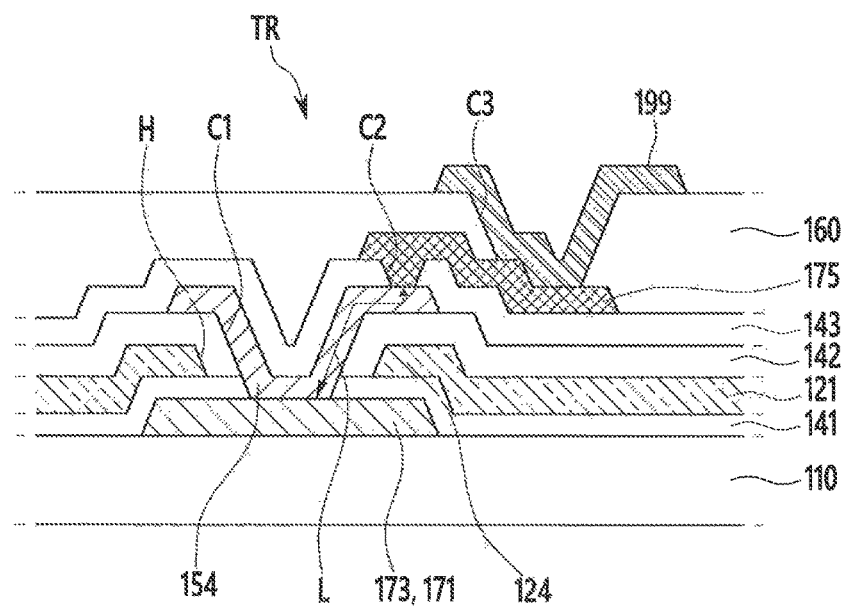
FIG. 12 is a cross-sectional view taken along a line XII-XII' of FIG. 11 according to an exemplary embodiment of the present invention.

FIG. 11 is a top plan view illustrating a transistor display panel according to an exemplary embodiment of the present invention, and FIG. 12 is a cross-sectional view taken along a line XII-XII' of FIG. 11 according to an exemplary embodiment of the present invention.

The present exemplary embodiment is different from an exemplary embodiment of FIG. 10 in the arrangement of the second electrode 175 of the transistor TR. For example, in an exemplary embodiment of the present invention and in FIG. 10, the second electrode 175 contacts a portion of the semiconductor layer 154 positioned in the contact hole C1 formed in the first and second insulating layers 141 and 142. However, in an exemplary embodiment of the present invention, the second electrode 175 is formed to be connected to a portion of the semiconductor layer 154 while positioned on the third insulating layer 143. For example, the second electrode 175 may be connected with a substantially horizontal portion of the peripheral portion of the semiconductor layer 154. For example, the peripheral portion of the semiconductor layer 154 may overlap the second insulating layer 142. For this connection formed by the second electrode 175 and semiconductor layer 154, the contact hole C2 formed in the third insulating layer 143 may be positioned, e.g., to overlap a peripheral portion of the semiconductor layer 154 without overlapping or while partially overlapping the contact hole C1, so as to be positioned beyond the contact hole C1. For example, the contact hole C2 might not overlap the inclined central portion of the semiconductor layer 154.

In an exemplary embodiment of the present invention and with reference to FIG. 10, since the area in which the semiconductor layer 154 and the second electrode 175 are in contact with each other is large, it is possible to secure a wide channel width, which may increase the size of the transistor TR. In contrast, a distance between the semiconductor layer 154 and the second electrode 175 may be narrow, and thus, it may be difficult to secure a sufficient channel length L. In an exemplary embodiment of the present invention and with reference to FIG. 12, a contact area between the second electrode 175 and the semiconductor layer 154 is small so that a channel width may be reduced. However, a distance between the first electrode 173 and the second electrode 175 is increased, which may increase the channel length L.

Exemplary embodiments of the present invention provide a transistor display panel including a vertical transistor that may increase a resolution and an aperture ratio of a display device.

The transistor display panel according to an exemplary embodiment of the present invention may be included in various display devices such as a liquid crystal display and an organic light emitting diode display. For example, the liquid crystal display may include a liquid crystal layer on a transistor display panel, and an organic light emitting diode display may include an organic emission layer on a transistor display panel.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A transistor display panel comprising:
    a substrate;
    a gate line disposed on the substrate;
    a data line disposed on the substrate; and
    a transistor disposed on the substrate,
    wherein the transistor includes:
    a first electrode;
    a second electrode overlapping the first electrode;
    a semiconductor layer disposed between the first electrode and the second electrode; and
    a gate electrode, wherein the semiconductor layer is disposed in an overlapping region where the gate line and the data line overlap each other.

2. The transistor display panel of claim 1, wherein the gate electrode surrounds at least a portion of the semiconductor layer.

3. The transistor display panel of claim 2, wherein the gate line includes a hole, and the semiconductor layer is disposed within the hole.

4. The transistor display panel of claim 3, wherein the hole overlaps the data line.

5. The transistor display panel of claim 1, wherein the first electrode is a part of the data line, and the gate electrode is a part of the gate line.

6. The transistor display panel of claim 5, wherein the first electrode is aligned in parallel with the data line, and the gate electrode is aligned in parallel with the gate line.

7. The transistor display panel of claim 1, further comprising:
    a first insulating layer disposed between the first electrode and the gate electrode; and
    a second insulating layer disposed between the gate electrode and the semiconductor layer,
    wherein the semiconductor layer is connected with the first electrode through a first contact hole formed in the first and second insulating layers.

8. The transistor display panel of claim 7, wherein the gate line includes a hole that surrounds the first contact hole, and the semiconductor layer is disposed within the first contact hole.

9. The transistor display panel of claim 8, wherein the second insulating layer overlaps the gate electrode.

10. The transistor display panel of claim 8, wherein the semiconductor layer has a column shape.

11. The transistor display panel of claim 7, further comprising
    an insulator disposed between the first insulating layer and the gate line.

12. The transistor display panel of claim 1, further comprising
    a pixel electrode electrically connected to the transistor.

13. The transistor display panel of claim 12, further comprising
    an insulating layer disposed between the second electrode and the pixel electrode,
    wherein the pixel electrode includes an extension connected with the second electrode through a second contact hole formed in the insulating layer.

14. The transistor display panel of claim 1, further comprising:
    a first insulating layer disposed between the first electrode and the gate electrode;
    a second insulating layer disposed between the gate electrode and the semiconductor layer; and
    a third insulating layer disposed on the semiconductor layer,
    wherein the semiconductor layer is connected with the first electrode through a first contact hole formed in the first and second insulating layers, and the second electrode is connected with the semiconductor layer through a second contact hole formed in the third insulating layer.

15. The transistor display panel of claim 14, wherein the second contact hole overlaps the first contact hole.

16. The transistor display panel of claim 14, wherein the semiconductor layer includes a central portion and a peripheral portion extending away from the central portion, wherein the central portion has an incline and the peripheral portion is substantially horizontal, and the second contact hole overlaps the peripheral portion, but does not overlap the central portion.

17. The transistor display panel of claim 1, wherein at least a part of each of the first electrode, the gate electrode, and the second electrode is disposed in the overlapping region.

18. The transistor display panel of claim 1, wherein the first electrode receives a data signal from the data line, and the gate electrode receives a gate signal from the gate line.

* * * * *